(12) United States Patent
Wikstrom

(10) Patent No.: US 7,071,736 B2
(45) Date of Patent: Jul. 4, 2006

(54) HALF-SWING LINE PRECHARGE METHOD AND APPARATUS

(75) Inventor: Jan A. Wikstrom, Chippewa Falls, WI (US)

(73) Assignee: Cray Inc., Seattle, WA (US)

( * ) Notice: Subject to any disclaimer, the term of this patent is extended or adjusted under 35 U.S.C. 154(b) by 80 days.

(21) Appl. No.: 10/848,690

(22) Filed: May 17, 2004

(65) Prior Publication Data

US 2004/0233752 A1    Nov. 25, 2004

Related U.S. Application Data

(60) Provisional application No. 60/472,175, filed on May 20, 2003.

(51) Int. Cl.
*H03K 19/096* (2006.01)
*H03K 3/289* (2006.01)

(52) U.S. Cl. .......................... 326/95; 326/93; 326/113; 327/202; 327/208

(58) Field of Classification Search .................. 326/93, 326/113
See application file for complete search history.

(56) References Cited

U.S. PATENT DOCUMENTS

| 4,963,774 | A |   | 10/1990 | Masuda |
| 5,257,226 | A |   | 10/1993 | McClure |
| 5,497,114 | A | * | 3/1996  | Shimozono et al. ........ 327/202 |
| 5,961,628 | A | * | 10/1999 | Nguyen et al. ................ 712/2 |
| 6,097,642 | A |   | 8/2000  | Takahashi |
| 6,292,405 | B1|   | 9/2001  | Nicosia et al. |
| 6,445,236 | B1| * | 9/2002  | Bernard et al. ............. 327/202 |
| 6,590,423 | B1| * | 7/2003  | Wong .......................... 326/93 |
| 6,646,472 | B1| * | 11/2003 | Trivedi et al. ................ 326/93 |
| 6,801,069 | B1| * | 10/2004 | Livolsi et al. .............. 327/208 |

OTHER PUBLICATIONS

Intersil Corporation, "CMOS Hex Buffer CD4503BMS", (12 92).

* cited by examiner

*Primary Examiner*—Vibol Tan
(74) *Attorney, Agent, or Firm*—Charles A. Lemaire; Lemaire Patent Law Firm, P.L.L.C.

(57) ABSTRACT

A method and apparatus of precharging data and/or address lines each having a large number of loads to a voltage midway between high and low using a source-follower configuration, and optionally driving only one-half of the precharge circuit based on a previous logical value on the line being precharged. In some embodiments, a driver circuit drives an output node either high or low during a first phase of each clock cycle, and a precharge circuit then precharges the output node to an intermediate voltage during a second phase of the clock cycle in preparation for the following clock cycle. Some embodiments include source-follower configured FETs to precharge, wherein these FETs turn off once the output voltage reaches an intermediate value.

31 Claims, 7 Drawing Sheets

HALF-SWING LINE PRECHARGE METHOD AND APPARATUS

RELATED APPLICATIONS

Benefit is claimed under 35 U.S.C. 119(e) to U.S. Provisional Application Ser. No. 60/472,175 entitled "HALF-SWING LINE PRECHARGE METHOD AND APPARATUS" by Jan A. Wikstrom, filed May 20, 2003, which is herein incorporated in its entirety by reference.

FIELD OF THE INVENTION

This invention relates to the field of digital CMOS electronic circuits, and more specifically to a method and apparatus of precharging lines having a large number of loads to a voltage midway between high and low using a source-follower configuration, and optionally driving only one-half of the circuit based on a previous logical value on the line being precharged.

BACKGROUND OF THE INVENTION

High-current driver circuits are often used to drive signal lines having a large number of loads. Complementary field-effect transistor (FET) technology, such as CMOS, typically have very little DC loading when driving gate inputs, since there is almost no current drawn across the gate, however there is an AC capacitive load due to capacitance of the gate. In order to achieve high-speed switching, a high-current driver is needed to provide or to remove the electron charge on that capacitance.

A computer system can include a plurality of vector processors, as well as scalar processors, memory, input/output subsystems, and other features.

Advanced vector processors include a large number of elements (e.g., 128 elements) in each vector register, and a relatively large number of vector registers in each vector processor. Data being stored to a vector register will typically need to be driven to at least one or two gates for every element of a vector register (e.g., 128 or 256 gates or more).

Further, high-speed vector processors often use a clocking scheme in which a high number of successive results on successive clocks to successive elements of a vector register.

Thus, there is a need for a high current driver that will quickly switch a large number of loads. There is also a need for a clocking scheme for the high-current driver that maximizes data throughput.

SUMMARY OF THE INVENTION

The present invention provides method and apparatus of precharging data and/or address lines each having a large number of loads to a voltage midway between high and low using a source-follower configuration, and optionally driving only one-half of the precharge circuit based on a previous logical value on the line being precharged. In some embodiments, a driver circuit drives an output node either high or low during a first phase of each clock cycle, and a precharge circuit then precharges the output node to an intermediate voltage during a second phase of the clock cycle in preparation for the following clock cycle.

DESCRIPTION OF PREFERRED EMBODIMENTS

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

Figure 1:
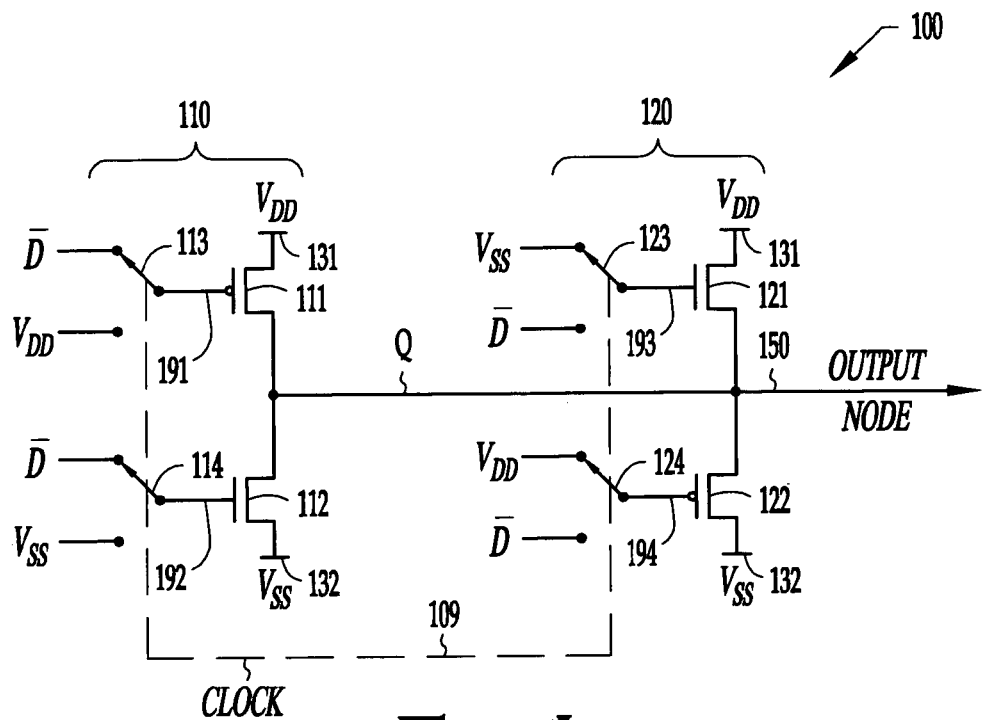
FIG. 1 shows a schematic representation of a precharge-driver circuit 100 of one embodiment of the present invention.

FIG. 1 shows a schematic representation of a precharge-driver circuit 100 of one embodiment of the present invention. Circuit 100 includes a driver circuit portion 110 and a precharge circuit portion 120. Driver circuit 110 includes a pair of complementary transistors 111 and 112 that drive output node 150. In some embodiments, pull-up transistor 111 is a PFET transistor and pull-down transistor 112 is an NFET transistor. In some embodiments, $V_{SS}$ supply voltage 132 is at ground, and $V_{DD}$ supply voltage 132 is either 2.5 volts, 1.8 volts, or 1.5 volts, or some other suitable voltage, depending on the semiconductor technology and dimensions. In other embodiments, other voltages are used, to suit the technology and the design objectives. As dimensions of the transistors shrink and speeds increase, lower voltages are typically used.

Figure 3:
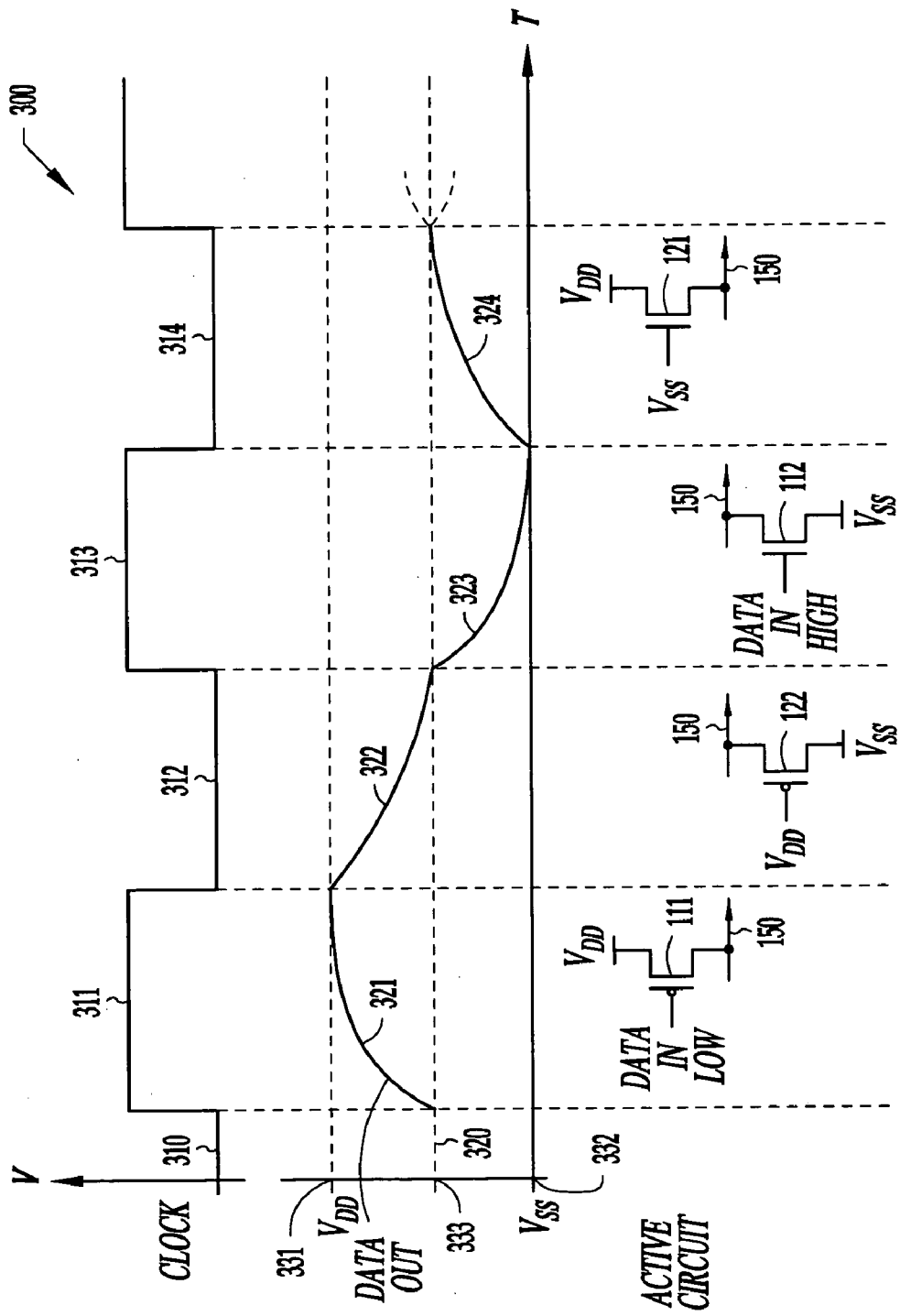
FIG. 3 shows a schematic representation of a timing diagram 300 and equivalent circuit of one embodiment of the present invention.

Referring to driver circuit 110 for circuit 100, when the input signal 191 of transistor 111 is low, transistor 111 turns on, and when the input signal 192 of transistor 112 is low, transistor 112 turns off, thus connecting output node 150 to $V_{DD}$ supply voltage 131 and driving the voltage of output node 150 high (an inverting function for the data). The voltage timing diagram 300 of FIG. 3 shows this during clock phase 311. Similarly, when the input signal 192 of transistor 112 is high, transistor 112 turns on, and when the input signal 191 of transistor 111 is high, transistor 111 turns off, connecting output node 150 to Vss supply voltage 132 and driving the voltage of output node 150 low (an inverting function for the data). The voltage timing diagram 300 of FIG. 3 shows this during clock phase 313. During a first phase of clock 109 (i.e., phases 311 and 313 of FIG. 3 are both during the first phase of clock 109), switches 113 and 114 are both in the up position. Thus, during this first phase when input data D-bar is present at the inputs of transistors 111 and 112 (e.g., in this example, when clock 109 is high), either one or the other of transistors 111 and 112 are on and the other is off, so the output data Q on output node 150 is the inverse of that data. In some embodiments, an input data signal D is inverted using an invertor (such as invertor 401 of FIGS. 4A, 4B, and 4C) to generate input data signal D-bar.

When the input signal 191 of transistor 111 is high, transistor 111 turns off, disconnecting output node 150 from $V_{DD}$ supply voltage 131 and letting other transistors drive the voltage of output node 150 (a tri-state function for the circuit). Similarly, when the input signal 192 of transistor 112 is low, transistor 112 turns off, disconnecting output node 150 from $V_{SS}$ supply voltage 132 and letting other transistors drive the voltage of output node 150 (a tri-state function for the circuit). During a second phase of clock 109, switches 113 and 114 are both in the down position. Thus, during this second phase when high voltage (e.g., $V_{DD}$) is present at the input of transistor 111 and low voltage (e.g., $V_{SS}$) is present at the input of transistor 112, both transistors are off and disconnected from output node 150.

Thus, during the first phase of clock 109, driver circuit 110 actively drives output node 150 with the inverse of input data D-bar, and during the second phase of clock 109, driver circuit 110 is turned off (tri-stated to high impedance).

Precharge circuit 120 includes a pair of complementary transistors 121 and 122 that drive output node 150 (in a mode often called a source-follower mode). In some embodiments, pull-up transistor 121 is an NFET transistor connected to power $V_{DD}$ supply voltage 131 and pull-down transistor 122 is a PFET transistor connected to power $V_{SS}$ supply voltage 132. Due to the respective threshold voltages of pull-up transistor 121 and pull-down transistor 122, neither can drive output node 150 close to the respective supply voltages, and in fact, even when the inputs are active, each of pull-up transistor 121 and pull-down transistor 122 will stop conducting when the output voltage reaches an intermediate voltage (e.g., about one-half of the $V_{DD}$ minus $V_{SS}$ difference, or about 0.9 volts for 1.8-volt technology).

Further, in some embodiments, when transistor 121 is turned on, the output voltage on node 150 will approach $V_{DD}$ minus $V_{THRESHOLD}$ minus $V_{INPUT}$, so by adjusting the voltage of the active-high input 193, transistor 121 can be made to turn itself off once it has driven output node 150 to the desired intermediate voltage. In some embodiments, the width/length ratio of transistor 121 is adjusted relative to the clock timing such that the voltage of output node 150 reaches the desired intermediate voltage at the end of the second phase of clock 109 even though the voltage would continue past the desired point if the second phase of the clock cycle were longer.

Figure 5:
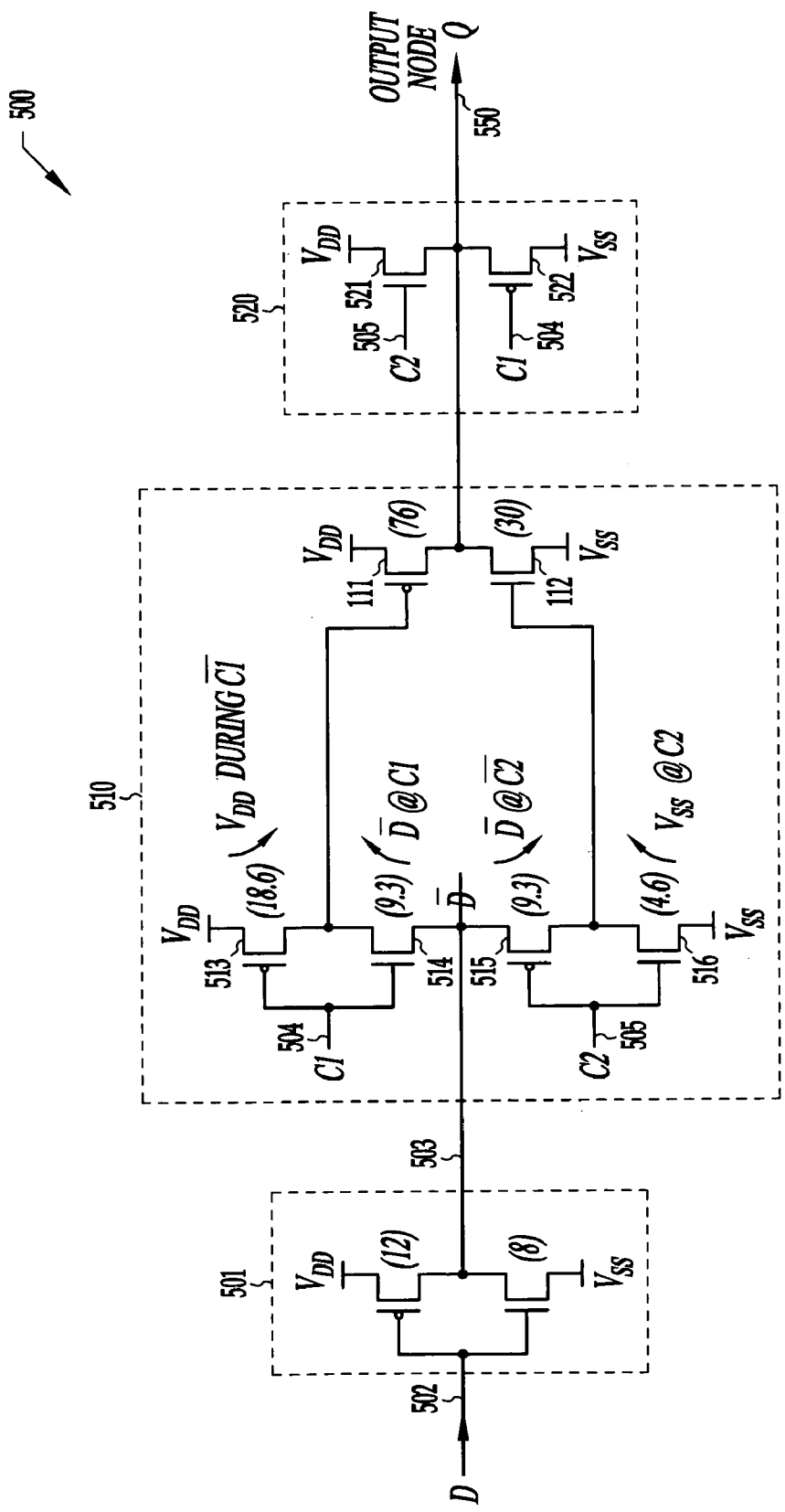
FIG. 5 shows a schematic representation of a precharge-driver circuit 500 of another embodiment of the present invention.
Figure 6:
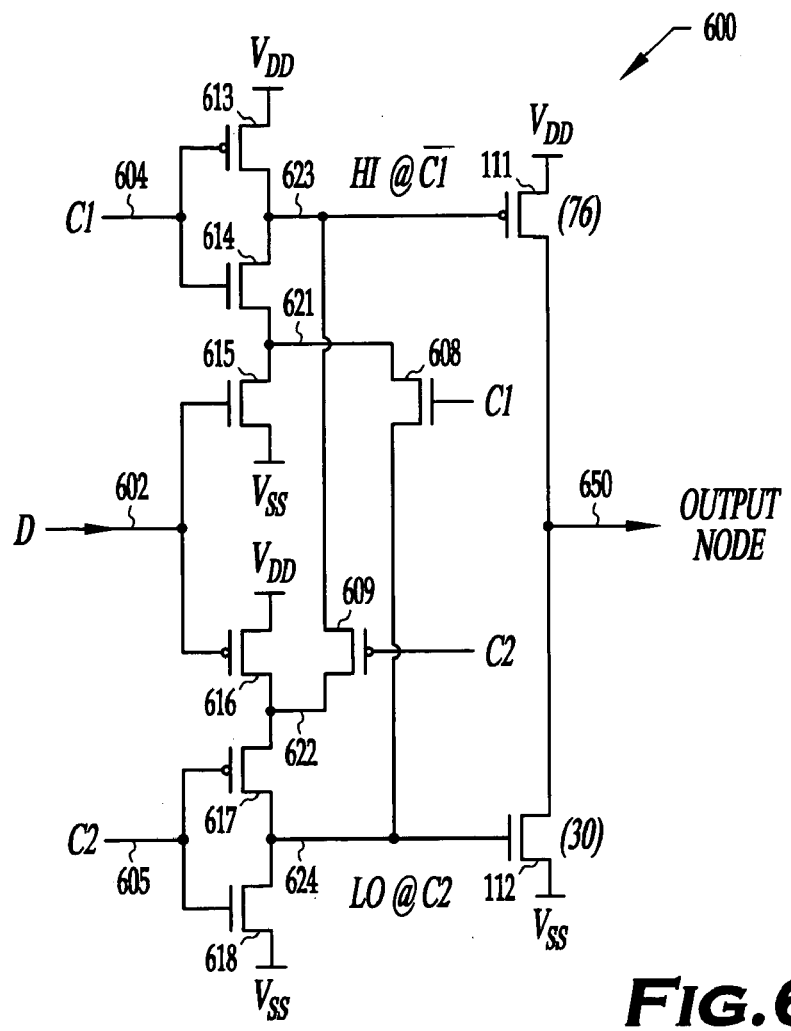
FIG. 6 shows a schematic representation of a precharge-driver circuit 600 of another embodiment of the present invention.

Referring to precharge circuit 120 in FIG. 1, when the input signal 193 of transistor 131 is low, transistor 121 turns off, disconnecting output node 150 from $V_{DD}$ supply voltage 131 and letting other transistors drive the voltage of output node 150 (a tri-state function for the circuit). Similarly, when the input signal 194 of transistor 122 is high, transistor 122 turns off, disconnecting output node 150 from $V_{SS}$ supply voltage 132 and letting other transistors drive the voltage of output node 150 (a tri-state function for the circuit). During a first phase of clock 109, electronic switches 123 and 124 are both in the up position (i.e., these schematically shown switches include transistors (e.g., as shown in FIGS. 5 and 6) that connect to the upper ("up position") or lower (down position) input signals). Thus, during this first phase when low voltage (e.g., $V_{SS}$) is present at the input of transistor 121 and high voltage (e.g., $V_{DD}$) is present at the input of transistor 122, both transistors 121 and 122 are off and disconnected from output node 150, allowing the one driver transistor (111 or 112) that is on in driver circuit 110 to drive output node 150.

Further, when the input signal 193 of transistor 121 is high, transistor 121 turns on (in a mode often called a source-follower mode), and when the input signal 194 of transistor 122 is high, transistor 122 turns off, thus connecting output node 150 to $V_{DD}$ supply voltage 131 and driving the voltage of output node 150 upwards (a source-follower type of non-inverting function for the D-bar data input through switch 123). The loads on output node 150 (typically a high number of FET gates) are capacitive, and the current drives the voltage upward. However, since the threshold voltage of transistor 121 stops transistor 121 from conducting at some intermediate voltage (rather than a voltage close to $V_{DD}$), the output node 150 and its loads, starting at a low voltage near $V_{SS}$, are precharged to that intermediate voltage, but no further. The voltage timing diagram 300 of FIG. 3 shows this precharging during clock phase 314.

Figure 4A:
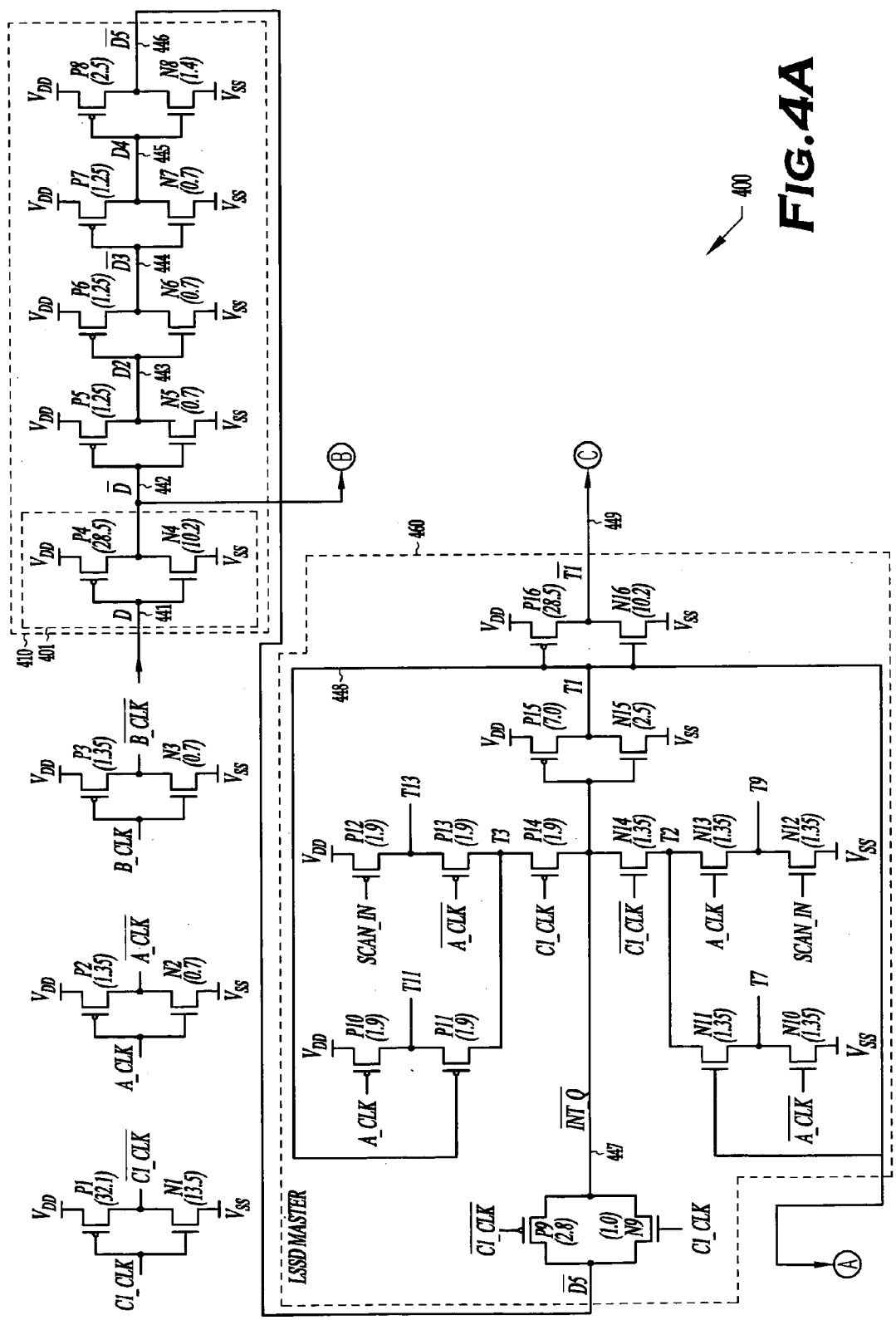
FIGS. 4A, 4B, and 4C show a schematic representation of a precharge-driver circuit 400 of another embodiment of the present invention.
Figure 4B:
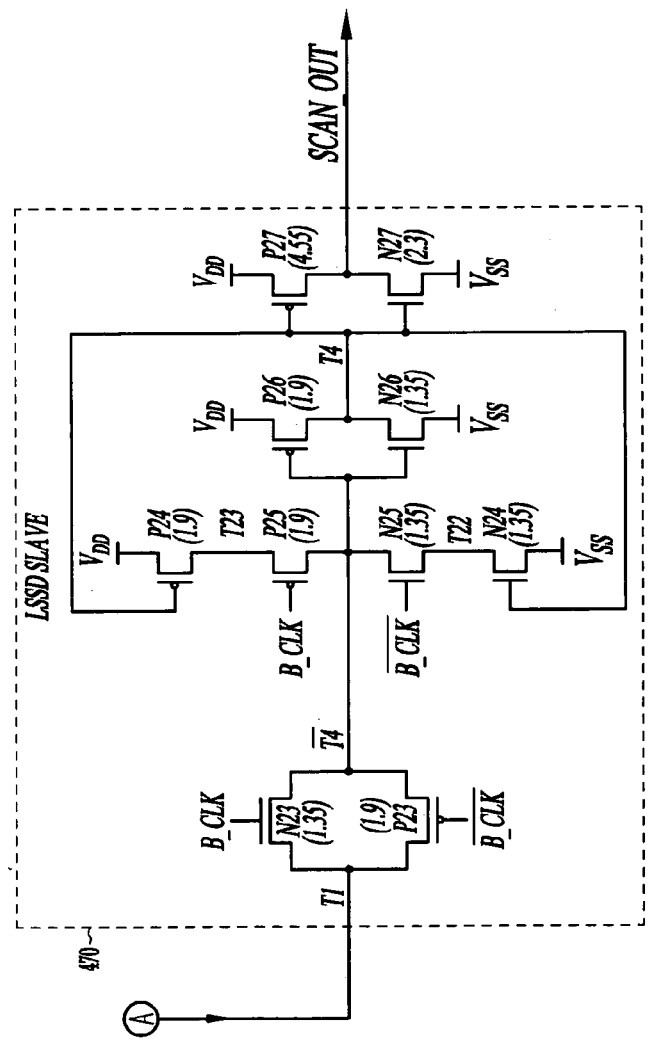
Figure 4B:
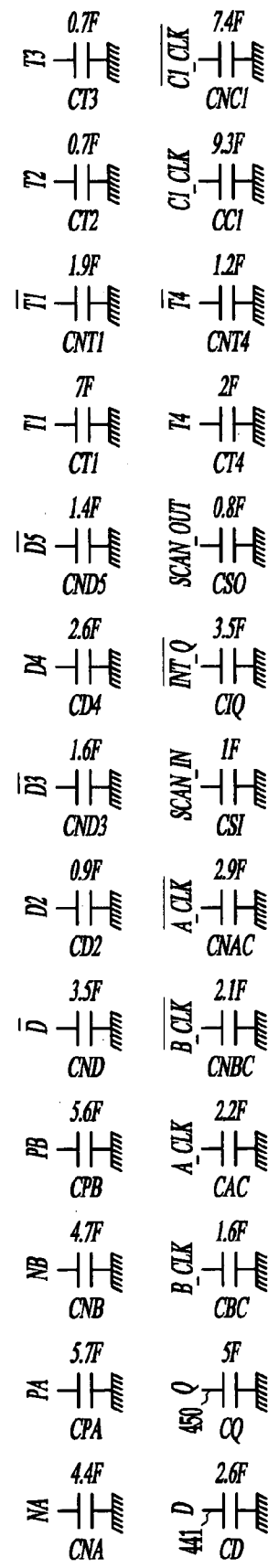
Figure 4C:
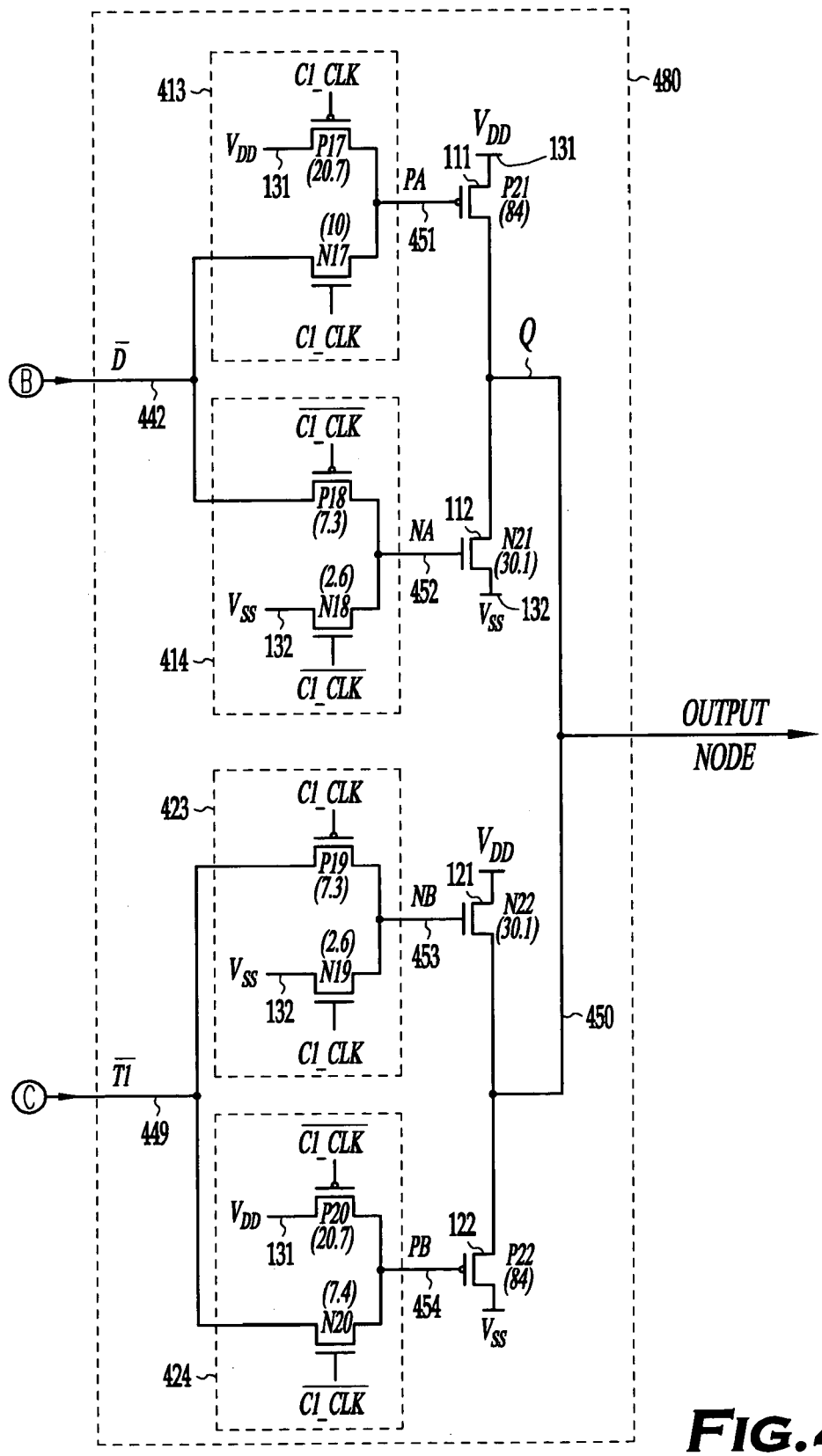

In some embodiments, the same D-bar data that drove transistors 111 and 112 during the first phase of the clock cycle is used to drive transistors 121 and 122 during the second phase of the clock cycle. In other embodiments, the D-bar data is inverted an even number of times to generate a version of the data called T-bar such as shown in FIGS. 4A, 4B, and 4C.

Similarly, when the input signal 194 of transistor 122 is low, transistor 122 turns on (in the mode often called source-follower mode), and when the input signal 193 of transistor 121 is low, transistor 121 turns off, connecting output node 150 to $V_{SS}$ supply voltage 132 and driving the voltage of output node 150 low (a source-follower type of non-inverting function for the D-bar data input through switch 124). The voltage timing diagram 300 of FIG. 3 shows this during clock phase 312.

During the first phase of clock 109 (i.e., phases 311 and 313 of FIG. 3 are both during the first phase of clock 109), switches 123 and 124 are both in the up position. Thus, during this first phase when $V_{SS}$ is present at the input of transistor 121 and $V_{DD}$ is present at the input of transistor 122 (e.g., in this example, when clock 109 is high), both transistors 121 and 122 are off.

During the second phase of clock 109 (i.e., phases 312 and 314 of FIG. 3 are both during the second phase of clock 109), switches 123 and 124 are both in the down position. Thus, during this second phase when D-bar is present at the inputs of both transistors 121 and 122 (e.g., in this example, when clock 109 is low), only one of transistors 121 or 122 is on, and the other is off. Because of the source follower configuration, the "on" transistor will only precharge the output node and its loads to the intermediate voltage.

Figure 2:
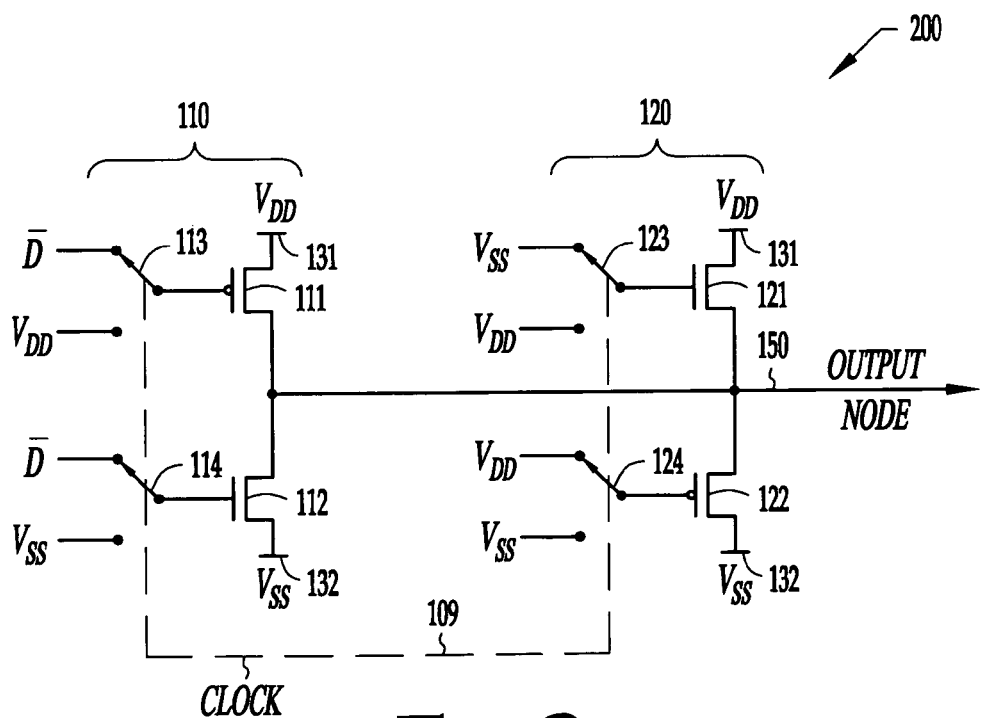
FIG. 2 shows a schematic representation of a precharge-driver circuit 200 of another embodiment of the present invention.

FIG. 2 shows a schematic representation of a precharge-driver circuit 200 of one embodiment of the present invention. This circuit is substantially identical to that of FIG. 1, except that when switch 123 is connected in the down position, it connects the gate of transistor 121 to $V_{DD}$, and switch 124 connects the gate of transistor 122 to $V_{SS}$. This, during the second phase of the clock cycle of clock 109, turns on both transistors 121 and 122 in the source follower mode, which may draw somewhat more current than the circuit of FIG. 1. However, due to the threshold voltage of each transistor, only one will primarily conduct current initially, while the other is essentially off.

FIG. 3 shows a schematic representation of a timing diagram 300 and equivalent circuit of one embodiment of the present invention. Waveform 310 represents a voltage-time graph of clock signal 109, while waveform 320 represents a voltage-time graph of the signal of output node 150. During first phase 311 of a first clock cycle of clock waveform 310, transistor 111 (e.g., a PFET transistor) is turned on so the voltage 321 rises to approach $V_{DD}$ (voltage value 331). During second phase 312 of the first clock cycle of clock waveform 310, transistor 122 (e.g., also a PFET transistor) is turned on so the voltage 321 falls toward $V_{SS}$, but stops well short of $V_{SS}$ at intermediate voltage value 333. During first phase 313 of a second clock cycle of clock waveform 310, transistor 111 (e.g., a NFET transistor) is turned on so the voltage 323 falls to approach $V_{SS}$ (voltage value 332). During second phase 314 of the second clock cycle of clock waveform 310, transistor 121 (e.g., also a NFET transistor) is turned on so the voltage 324 rises toward $V_{DD}$, but stops well short of $V_{DD}$ again at intermediate voltage value 333.

FIGS. 4A, 4B, and 4C show a schematic representation of a precharge-driver circuit 400 of one embodiment of the present invention. Circuit 400 includes an LSSD (level-sensitive scan design) master latch 460 and an LSSD slave latch 470. Input signal 441 is inverted by invertor 401 (including transistor P4 having a width-length ratio of about 28.5 in some embodiments, and transistor N4 having a width-length ratio of about 10.2 in some embodiments) to generate D-bar signal 442, which is used to drive the output stage 480. The rest of invertor chain 410 (i.e., transistors N5 and P5 which generate D2 signal 442, transistors N6 and P6 which generate D3-bar signal 443, transistors N7 and P7 which generate D4 signal 445, and transistors N8 and P8 which generate D5-bar signal 446) provides additional inversions and re-inversions of the logical signal to generate D5-bar signal 446.

During the first phase of the clock cycle of C1_CLK, the pass gate of transistors P9 and N9 gates signal 446 to node 447, and it is then inverted by the invertor of transistors P15 and N15 to form T1 signal 448, which is then inverted by the invertor of transistors P16 and N16 to form T1-bar signal 449.

FIGS. 4A, 4B, and 4C show the width-length ratio of each of PFET transistors P1 through P27 and NFET transistors N1 through N27 for one embodiment of the invention. The invertor of P1 and N1 has an input of C1_CLK and provides an output of C1_CLK-bar. C1_CLK and C1_CLK-bar are used throughout circuit 400 to control the switches for the first phase and second phase of the clock cycle. The invertor of P2 and N2 has an input of A_CLK and provides an output of A_CLK-bar. A_CLK and A_CLK-bar are used throughout circuit 400 to control latching of scan data into the LSSD master 460. The invertor of P3 and N3 has an input of B_CLK and provides an output of B_CLK-bar. B_CLK and B_CLK-bar are used throughout circuit 400 to control latching of scan data into the LSSD slave 470.

During the first phase of the clock cycle of C1_CLK, the transistor N17 of pass gate 413 gates D-bar signal 442 as signal 451 to the gate of driver transistor 111 (also referenced as PFET P21), which turns transistor 111 on if D-bar is low (driving output node 450 high) and turns transistor 111 off if D-bar is high. Also during the first phase of the clock cycle of C1_CLK, the transistor P18 of pass gate 414 gates D-bar signal 442 as signal 452 to the gate of driver transistor 112 (also referenced as NFET N21), which turns transistor 112 on if D-bar is high (driving output node 450 low) and turns transistor 112 off if D-bar is low. Thus, signal Q on output node 450 is driven to the value D of input signal 441 during the first phase of C1_CLK. During the second phase of C1_CLK, both transistors 111 and 112 are turned off by gating VDD to the gate of transistor 111 through pass transistor P17 and gating $V_{SS}$ to the gate of transistor 112 through pass transistor N18.

During the first phase of the clock cycle of C1_CLK, both transistors 121 and 122 are turned off by gating $V_{SS}$ as signal 453 to the gate of transistor 121 (NFET N22) through pass transistor N19 and gating $V_{DD}$ as signal 454 to the gate of transistor 122 (PFET P22) through pass transistor P20. The transistor N17 of pass gate 413 (transistors P17 and N17) gates D-bar signal 442 to the gate of driver transistor 111 (also referenced as PFET P21), which turns transistor 111 on if D-bar is low (driving output node 450 high) and turns transistor 111 off if D-bar is high. Also during the first phase of the clock cycle of C1_CLK, the transistor P18 of pass gate 414 (transistors P18 and N18) gates D-bar signal 442 to the gate of driver transistor 112 (also referenced as NFET N21), which turns transistor 112 on if D-bar is high (driving output node 450 low) and turns transistor 112 off if D-bar is low. Thus, signal Q on output node 450 is driven to the value D of input signal 441 during the first phase of C1_CLK.

During the second phase of C1_CLK, T1-bar signal 449 is gated through transistor P18 of pass gate 423 (transistors P19 and N19) to the gate of N22 NFET 121, which is in a source-follower configuration. T1-bar signal 449 maintains the data value of D1-bar for this second phase of C1_CLK. Thus, if the output Q signal 450 was driven low during the first phase of C1_CLK, and T1-bar will be high, turning on transistor 121 to increase the voltage towards $V_{DD}$ (transistor 122 will be off if T1-bar is high), but transistor 121, being an NFET, will turn off before driving the output to $V_{DD}$ due to the threshold voltage of transistor 121. This will leave the output node 450 as a voltage approximately half way between $V_{DD}$ and $V_{SS}$, precharged for the next clock cycle of C1_CLK.

Conversely, during the second phase of C1_CLK, T1-bar signal 449 is also gated through transistor N20 of pass gate 424 (transistors P20 and N20) to the gate of P22 PFET 122, which is also in a source-follower configuration. Thus, if the output Q signal 450 was driven high during the first phase of C1_CLK, and T1-bar will be low, turning on transistor 122 to decrease the voltage towards $V_{SS}$, but transistor 122, being a PFET, will turn off before driving the output to $V_{SS}$ due to the threshold voltage of transistor 122. This will leave the output node 450 as a voltage approximately half way between $V_{DD}$ and $V_{SS}$, precharged for the next clock cycle of C1_CLK.

During the second phase of the clock cycle of C1_CLK, both transistors 111 and 112 are turned off by gating $V_{DD}$ as signal 451 to the gate of transistor 111 (PFET P21) through pass transistor P17 and gating $V_{SS}$ as signal 452 to the gate of transistor 112 (NFET N21) through pass transistor N18.

Thus, the output node 450 is driven to the value of input signal D 441 during the first phase of C1_CLK, and is driven, during the second phase of C1_CLK, to a voltage approximately half way between $V_{DD}$ and $V_{SS}$, precharged for the next clock cycle of C1_CLK. This increases the speed at which the operating voltage for the data for the next cycle is established, and thus increases the speed of the system.

FIG. 5 shows a schematic representation of a precharge-driver circuit 500 of one embodiment of the present invention. Circuit 500 includes an input inverter 501 (in some embodiments, having a PFET relative gate width of 12, and an NFET relative gate width of 8), which inverts input signal D 502 and generates signal D-bar 503 (the inverted value of data signal D). Clock signal C1 504 is high for the first phase and low during the second phase and clock signal C2 505 is the inverse of C1 504 and is low during the first phase and high during the second phase. Thus, during the first phase when C1 504 is high, NFET transistor 514 (relative gate width of 9.3, in some embodiments) is on, transmitting D-bar to the gate of PFET transistor 111 (relative gate width of 76, in some embodiments), and C2 505 is low turning on PFET transistor 515 (relative gate width of 9.3, in some embodiments) transmitting D-bar to the gate of NFET transistor 112 (relative gate width of 30, in some embodiments). Thus transistors 111 and 112 invert signal D-bar to form signal Q on output node 550 for the first phase (when C1 504 is high), and transistors 522 and 521 are both turned off. Thus, during the first phase when C1 504 is high, output node 550 (signal Q) is driven to the data value of input signal D 502.

During the second phase when C1 504 is low, transistors 514 and 515 are off but PFET transistor 513 (relative gate width of 18.6, in some embodiments) is on, transmitting $V_{DD}$ to the gate of PFET transistor 111 turning it off, and C2 505 is high turning on NFET transistor 516 (relative gate width of 4.6, in some embodiments) transmitting $V_{SS}$ to the gate of NFET transistor 112 turning it off. Thus, both transistors 111 and 112 are off and not driving output node 550. However, during the second phase, C2 505 is high, which turns on transistor 521 only if output Q at node 550 is low (transistor 522 is off in this case) driving the output node 450 to a higher voltage, and transistor 521 turns off once the output node 550 reaches an intermediate voltage between $V_{DD}$ and $V_{SS}$ due to the threshold voltage of transistor 521. Further, during the second phase, C1 504 is low, which turns on transistor 522 only if output Q at node 550 is high (transistor 521 is off in this case), driving the output node 450 to a lower voltage and transistor 521 turns off once the output node 550 reaches an intermediate voltage between $V_{DD}$ and $V_{SS}$ due to the threshold voltage of transistor 522. Thus, during the second phase when C1 504 is low, output node 550 is precharged for the next clock cycle.

In some embodiments, one or more of the drivers described above are used to drive the input circuits for a set of vector registers. In other embodiments, they drive any other suitable receiving circuit line that benefits from the speed increase resulting from driving the input line to a half-swing voltage before driving data to that line.

FIG. 6 shows a schematic representation of a tri-state driver circuit 600 of one embodiment of the present invention. Clock signal C1 604 is high for the first phase and low during the second phase and clock signal C2 605 is the inverse of C1 604 and is low during the first phase and high during the second phase. When input signal D 602 is high, NFET transistor 615 is on driving internal node 621 low (to $V_{SS}$), and PFET transistor 616 is off floating internal node 622. Thus when input D 602 is high, during the first phase when C1 604 is high, NFET transistor 614 is on, transmitting D-bar (low value) to the gate of PFET transistor 111 turning it on and driving output node 650 high, and transistor 608 is on, transmitting node 621's D-bar (low value) to the gate of NFET transistor 112 turning it off. When input signal D 602 is low, PFET transistor 616 is on driving internal node 622 high (to $V_{DD}$), and PFET transistor 615 is off floating internal node 621. Thus when input D 602 is low, then during the first phase when C2 605 is low, PFET transistor 617 is on, transmitting D-bar (high value) to the gate of NFET transistor 112 turning it on and driving output node 650 low, and transistor 609 is on, transmitting node 622's D-bar (high value) to the gate of PFET transistor 111 turning it off.

During the second phase, C1 is low and C2 is high, which turns off transistors 614, 608, 617, and 609 disconnecting signal D from the output transistors 111 and 112. This also turns on PFET transistor 613 connecting $V_{DD}$ to the gate of PFET output transistor 111 turning it off, and also turns on NFET transistor 618 connecting $V_{SS}$ to the gate of NFET output transistor 112 turning it off. Thus transistors 111 and 112 drive the value of signal D to form signal Q on output node 650 for the first phase (when C1 is high). During the second phase, both transistors 111 and 112 are turned off. In some embodiments, this tri-state driver is used to drive the input circuits for a set of vector registers.

Figure 7:
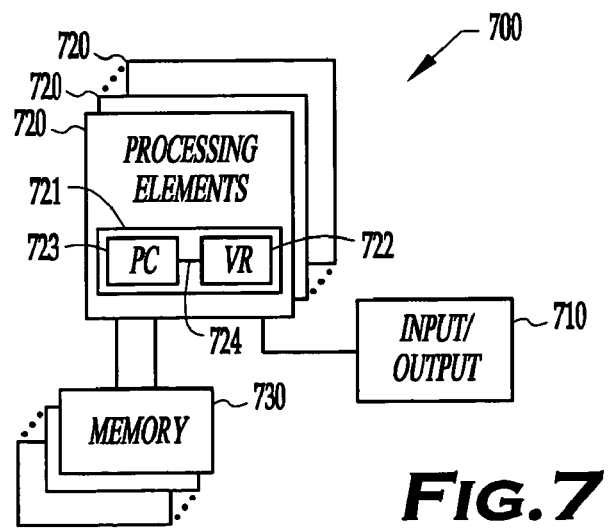
FIG. 7 shows a schematic of an information-processing system 700.

FIG. 7 shows a schematic of an information-processing system 700. System 700 includes a memory 730. (including one or more sections), an input-output subsystem 710, one or more processing elements 720, each including a vector processing unit 721 operatively coupled to the memory 730 and to the input-output subsystem 710, the vector processing unit 721 further comprising a set of vector registers 722, wherein the set of vector registers includes an input 724, and a clocked vector register drive-and-precharge circuit 723, wherein the drive-and-precharge circuit includes one or more of the above described circuits of FIGS. 1, 2, 3, 4, 5, and/or 6. Circuit 723 in general includes a driver circuit having an output node connected to the input of the set of vector registers and a pair of complementary drive transistors configured to drive a first data signal onto the output node during a first phase of a clock cycle and configured to turn off during a second phase of the clock cycle, and a precharge circuit coupled to the output node and configured to turn off during the first phase of the clock cycle and configured to drive the output node to an intermediate voltage during the second phase of the clock cycle.

One embodiment of the invention provides a drive-and-precharge circuit including a driver circuit having an output node and a pair of CMOS drive transistors including an NMOS driver transistor having a gate and having a controlled current path connected between a $V_{SS}$ voltage and the output node and a PMOS driver transistor having a gate and having a controlled current path connected between a $V_{DD}$ voltage and the output node, a first driver input circuit that couples a first data signal to the gate of the NMOS driver transistor during a first phase of a clock cycle and couples a voltage that turns off the NMOS driver transistor during a second phase of the clock cycle, and a second driver input circuit that couples the first data signal to the gate of the PMOS driver transistor during the first phase of the clock cycle and couples a voltage that turns off the PMOS driver transistor during the second phase of the clock cycle. The drive-and-precharge circuit also includes a PMOS precharge transistor having a gate and having a controlled current path connected between the $V_{SS}$ voltage and the output node, an NMOS precharge transistor having a gate and having a controlled current path connected between the $V_{DD}$ voltage and the output node, a first precharge input circuit that couples a second data signal to the gate of the PMOS precharge transistor during the second phase of the clock cycle and couples a voltage that turns off the PMOS precharge transistor during the first phase of the clock cycle, and a second precharge input circuit that couples the second data signal to the gate of the NMOS precharge transistor during a second phase of a clock cycle and couples a voltage that turns off the NMOS precharge transistor during the first phase of the clock cycle.

Some embodiments of the invention include a clocked vector register drive-and-precharge circuit. This circuit includes a driver circuit having an output node and a pair of complementary drive transistors configured to drive a first data signal onto the output node during a first phase of a clock cycle and configured to turn off during a second phase of the clock cycle, and a precharge circuit coupled to the output node and configured to turn off during the first phase of the clock cycle and configured to drive the output node to an intermediate voltage during the second phase of the clock cycle.

In some embodiments, the precharge circuit substantially reduces its current flow once the output node approaches the intermediate voltage.

In some embodiments, a value of the first data signal is coupled to the precharge circuit during to control a direction of change in voltage of the output node.

In some embodiments, the pair of complementary drive transistors includes an N-type drive transistor and a P-type drive transistor.

In some embodiments, the precharge circuit includes a P-type precharge transistor having a first node electrically connected to a first node of the N-type drive transistor and having second node electrically connected to a second node of the N-type drive transistor and to the output node, and an N-type precharge transistor having a first node electrically connected to a first node of the P-type drive transistor and to the output node and having second node electrically connected to a second node of the P-type drive transistor.

Some embodiments further include a first transistor that connects a voltage to a gate of the P-type precharge transistor that turns off the P-type precharge transistor during the first phase of the clock cycle, a second transistor that connects a voltage to a gate of the N-type precharge transistor that turns off the N-type precharge transistor during the first phase of the clock cycle, a third transistor that connects a first data signal to a gate of the P-type drive transistor during the first phase of the clock cycle, a fourth transistor that connects the first data signal to a gate of the N-type drive transistor during the first phase of the clock cycle, a fifth transistor that connects a voltage to a gate of the P-type drive transistor that turns off the P-type drive transistor during the second phase of the clock cycle, a sixth transistor that connects a voltage to a gate of the N-type drive transistor that turns off the N-type drive transistor during the second phase of the clock cycle, a seventh transistor that connects a second data signal to a gate of the P-type precharge transistor during the second phase of the clock cycle, wherein a value of the second data signal during the second phase of the clock cycle is based on a value of the first data signal during the first phase of the clock cycle, and a eighth transistor that connects the second data signal to a gate of the N-type precharge transistor during the second phase of the clock cycle.

In some embodiments, the pair of complementary drive transistors includes an N-type drive transistor and a P-type drive transistor, and wherein the precharge circuit includes a P-type precharge transistor having a first node electrically connected to a first node of the N-type drive transistor and having second node electrically connected to a second node of the N-type drive transistor and to the output node, and an N-type precharge transistor having a first node electrically connected to a first node of the P-type drive transistor and to the output node and having second node electrically connected to a second node of the P-type drive transistor, and the circuit further includes:

a first transistor that connects a voltage to a gate of the P-type precharge transistor that turns off the P-type precharge transistor during the first phase of the clock cycle, a second transistor that connects a voltage to a gate of the N-type precharge transistor that turns off the N-type precharge transistor during the first phase of the clock cycle, a third transistor that connects a first data signal to a gate of the P-type drive transistor during the first phase of the clock cycle, a fourth transistor that connects the first data signal to a gate of the N-type drive transistor during the first phase of the clock cycle, a fifth transistor that connects a voltage to a gate of the P-type drive transistor that turns off the P-type drive transistor during the second phase of the clock cycle, a sixth transistor that connects a voltage to a gate of the N-type drive transistor that turns off the N-type drive transistor during the second phase of the clock cycle, a seventh transistor that connects a second data signal to a gate of the P-type precharge transistor during the second phase of the clock cycle, wherein a value of the second data signal during the second phase of the clock cycle is based on a value of the first data signal during the first phase of the clock cycle, and a eighth transistor that connects the second data signal to a gate of the N-type precharge transistor during the second phase of the clock cycle.

Another aspect of the invention provides embodiments that have a clocked vector register drive-and-precharge circuit that includes a driver circuit having an output node and a pair of complementary drive transistors including an N-type driver transistor having a gate and having a controlled current path connected between a first supply voltage and the output node and a P-type driver transistor having a gate and having a controlled current path connected between a second supply voltage and the output node, a first driver input circuit that couples a first data signal to the gate of the N-type driver transistor during a first phase of a clock cycle and couples a signal that turns off the N-type driver transistor during a second phase of the clock cycle, a second driver input circuit that couples the first data signal to the gate of the P-type driver transistor during the first phase of the clock cycle and couples a voltage that turns off the P-type driver transistor during the second phase of the clock cycle, a P-type precharge transistor having a gate and having a controlled current path connected between the first supply voltage and the output node, a N-type precharge transistor having a gate and having a controlled current path connected between the second supply voltage and the output node, a first precharge input circuit that couples a voltage that turns off the P-type precharge transistor during the first phase of the clock cycle and couples a second data signal to the gate of the P-type precharge transistor during the second phase of the clock cycle, and a second precharge input circuit that couples a voltage that turns off the N-type precharge transistor during the first phase of the clock cycle and couples the second data signal to the gate of the N-type precharge transistor during a second phase of a clock cycle.

In some embodiments, the N-type drive transistor is an NMOS device, the P-type drive transistor is a PMOS device, the N-type precharge transistor is an NMOS device, and the P-type precharge transistor is a PMOS device.

In some embodiments, a threshold voltage of the P-type precharge transistor reduces current flow through the P-type precharge transistor once the output node reaches an intermediate voltage, and wherein a threshold voltage of the N-type precharge transistor reduces current flow through the N-type precharge transistor once the output node reaches an intermediate voltage.

Another aspect of the invention includes embodiments that have an information-processing system 700 including a memory 730, an input-output processing elements 720, each PE 720 including a vector processing unit 721 operatively coupled to the memory 730 and to the input-output subsystem 710, the vector processing unit 721 further comprising a set of vector registers 722, wherein the set of vector registers 722 includes an input 724, and a clocked vector register drive-and-precharge circuit 723, wherein the drive-and-precharge circuit includes a driver circuit having an output node connected to the input of the set of vector registers and a pair of complementary drive transistors configured to drive a first data signal onto the output node during a first phase of a clock cycle and configured to turn off during a second phase of the clock cycle, and a precharge circuit coupled to the output node and configured to turn off during the first phase of the clock cycle and configured to drive the output node to an intermediate voltage during the second phase of the clock cycle.

In some such embodiments, the precharge circuit substantially reduces its current flow once the output node approaches the intermediate voltage.

In some embodiments, a value of the first data signal is coupled to the precharge circuit to control a direction of change in voltage of the output node.

In some embodiments, the pair of complementary drive transistors includes an N-type drive transistor and a P-type drive transistor, and wherein the precharge circuit includes a P-type precharge transistor having a first node electrically connected to a first node of the N-type drive transistor and having second node electrically connected to a second node of the N-type drive transistor and to the output node, and an N-type precharge transistor having a first node electrically connected to a first node of the P-type drive transistor and to the output node and having second node electrically connected to a second node of the P-type drive transistor.

In some embodiments, the pair of complementary drive transistors includes an N-type drive transistor and a P-type drive transistor, and wherein the precharge circuit includes a P-type precharge transistor having a first node electrically connected to a first node of the N-type drive transistor and having second node electrically connected to a second node of the N-type drive transistor and to the output node, and an N-type precharge transistor having a first node electrically connected to a first node of the P-type drive transistor and to the output node and having second node electrically connected to a second node of the P-type drive transistor. The circuit further includes a first transistor that connects a voltage to a gate of the P-type precharge transistor that turns off the P-type precharge transistor during the first phase of the clock cycle, a second transistor that connects a voltage to a gate of the N-type precharge transistor that turns off the N-type precharge transistor during the first phase of the clock cycle, a third transistor that connects a first data signal to a gate of the P-type drive transistor during the first phase of the clock cycle, a fourth transistor that connects the first data signal to a gate of the N-type drive transistor during the first phase of the clock cycle, a fifth transistor that connects a voltage to a gate of the P-type drive transistor that turns off the P-type drive transistor during the second phase of the clock cycle, a sixth transistor that connects a voltage to a gate of the N-type drive transistor that turns off the N-type drive transistor during the second phase of the clock cycle, a seventh transistor that connects a second data signal to a gate of the P-type precharge transistor during the second phase of the clock cycle, wherein a value of the second data signal during the second phase of the clock cycle is based on a value of the first data signal during the first phase of the clock cycle, and a eighth transistor that connects the second data signal to a gate of the N-type precharge transistor during the second phase of the clock cycle.

Another aspect of the invention provides (in some embodiments) a method for driving a clocked vector register drive-and-precharge circuit including driving an output node of the clocked vector register drive-and-precharge circuit to a data value during a first phase of a clock cycle, if a voltage corresponding to the data value of the output node is high during the first phase of the clock cycle, then driving the output node down toward an intermediate voltage during a second phase of the clock cycle, and if the voltage corresponding to the data value of the output node is low during the first phase of the clock cycle, then driving the output node up toward the intermediate voltage during the second phase of the clock cycle.

In some such embodiments, the driving the output node down toward an intermediate voltage includes providing a relatively high initial amount of current and then reducing the amount of current drive as the output node approaches the intermediate voltage.

In some embodiments, the driving the output node up toward an intermediate voltage includes providing a relatively high initial amount of current and then reducing the amount of current drive as the output node approaches the intermediate voltage.

In some embodiments, the first phase of the clock cycle and the second phase of the clock cycle are each approximately one-half of the clock cycle.

Some embodiments of the invention include a system for driving a clocked vector register drive-and-precharge circuit including a clock signal, and means as described herein, operatively coupled to the clock signal, for driving an output node of the clocked vector register drive-and-precharge circuit to a data value during a first phase of the clock signal, and if a voltage corresponding to the data value of the output node is high during the first phase of the clock cycle, then driving the output node down toward an intermediate voltage during a second phase of the clock signal, and if the voltage corresponding to the data value of the output node is low during the first phase of the clock signal, then driving the output node up toward the intermediate voltage during the second phase of the clock cycle.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A clocked drive-and-precharge circuit comprising:
   a driver circuit having an output node and including complementary drive transistors configured to drive a first data signal onto the output node during a first phase of a clock cycle and configured to turn off during a second phase of the clock cycle; and a precharge circuit having complementary precharge transistors wired in a source-follower configuration and coupled to the output node and configured to turn off during the first phase of the clock cycle and configured to have their gates connected to voltage supplies during the second phase of the clock cycle independent of prior data values in order to drive the output node to an intermediate voltage during the second phase of the clock cycle.

2. The circuit of claim 1, wherein the precharge circuit substantially reduces its current flow once the output node approaches the intermediate voltage.

3. The circuit of claim 1, wherein a value of the first data signal is coupled to the precharge circuit during to control a direction of change in voltage of the output node.

4. The circuit of claim 1, wherein the pair of complementary drive transistors includes an N-type drive transistor and a P-type drive transistor.

5. The circuit of claim 4, wherein the precharge circuit includes:
- a P-type precharge transistor having a first node electrically connected to a first node of the N-type drive transistor and having second node electrically connected to a second node of the N-type drive transistor and to the output node; and
- an N-type precharge transistor having a first node electrically connected to a first node of the P-type drive transistor and to the output node and having second node electrically connected to a second node of the P-type drive transistor.

6. The circuit of claim 5, further comprising:
- a first clock signal that connects a voltage to a gate of the P-type precharge transistor that turns off the P-type precharge transistor during the first phase of the clock cycle;
- a second clock signal that connects a voltage to a gate of the N-type precharge transistor that turns off the N-type precharge transistor during the first phase of the clock cycle;
- a third transistor that connects a first data signal to a gate of the P-type drive transistor during the first phase of the clock cycle;
- a fourth transistor that connects the first data signal to a gate of the N-type drive transistor during the first phase of the clock cycle;
- a fifth transistor that connects a voltage to a gate of the P-type drive transistor that turns off the P-type drive transistor during the second phase of the clock cycle; and
- a sixth transistor that connects a voltage to a gate of the N-type drive transistor that turns off the N-type drive transistor during the second phase of the clock cycle.

7. A clocked drive-and-precharge circuit comprising:
- a driver circuit having an output node and including complementary drive transistors configured to drive a first data signal onto the output node during a first phase of a clock cycle and configured to turn off during a second phase of the clock cycle; and
- a precharge circuit having complementary transistors wired in a source-follower configuration and coupled to the output node and configured to turn off during the first phase of the clock cycle and configured to drive the output node to an intermediate voltage during the second phase of the clock cycle, wherein the pair of complementary drive transistors includes an N-type drive transistor and a P-type drive transistor, and wherein the precharge circuit includes a P-type precharge transistor having a first node electrically connected to a first node of the N-type drive transistor and having second node electrically connected to a second node of the N-type drive transistor and to the output node, and an N-type precharge transistor having a first node electrically connected to a first node of the P-type drive transistor and to the output node and having second node electrically connected to a second node of the P-type drive transistor, and wherein the circuit further comprises:
- a first transistor that connects a voltage to a gate of the P-type precharge transistor that turns off the P-type precharge transistor during the first phase of the clock cycle;
- a second transistor that connects a voltage to a gate of the N-type precharge transistor that turns off the N-type precharge transistor during the first phase of the clock cycle;
- a third transistor that connects a first data signal to a gate of the P-type drive transistor during the first phase of the clock cycle;
- a fourth transistor that connects the first data signal to a gate of the N-type drive transistor during the first phase of the clock cycle;
- a fifth transistor that connects a voltage to a gate of the P-type drive transistor that turns off the P-type drive transistor during the second phase of the clock cycle;
- a sixth transistor that connects a voltage to a gate of the N-type drive transistor that turns off the N-type drive transistor during the second phase of the clock cycle;
- a seventh transistor that connects a second data signal to a gate of the P-type precharge transistor during the second phase of the clock cycle, wherein a value of the second data signal during the second phase of the clock cycle is based on a value of the first data signal during the first phase of the clock cycle; and
- an eighth transistor that connects the second data signal to a gate of the N-type pre charge transistor during the second phase of the clock cycle.

8. A clocked vector register drive-and-precharge circuit comprising:
- a driver circuit having an output node and a pair of complementary drive transistors including an N-type driver transistor having a gate and having a controlled current path connected between a first supply voltage and the output node and a P-type driver transistor having a gate and having a controlled current path connected between a second supply voltage and the output node;
- a first driver input circuit that couples a first data signal to the gate of the N-type driver transistor during a first phase of a clock cycle and couples a signal that turns off the N-type driver transistor during a second phase of the clock cycle;
- a second driver input circuit that couples the first data signal to the gate of the P-type driver transistor during the first phase of the clock cycle and couples a voltage that turns off the P-type driver transistor during the second phase of the clock cycle;
- a P-type precharge transistor having a gate and having a controlled current path connected between the first supply voltage and the output node;
- an N-type precharge transistor having a gate and having a controlled current path connected between the second supply voltage and the output node;
- a first precharge input circuit that couples a voltage that turns off the P-type precharge transistor during the first phase of the clock cycle and couples a second data signal to the gate of the P-type precharge transistor during the second phase of the clock cycle; and a second precharge input circuit that couples a voltage that turns off the N- type precharge transistor during the first phase of the clock cycle and couples the second data signal to the gate of the N-type precharge transistor during a second phase of a clock cycle.

9. The circuit of claim 8, wherein
the N-type drive transistor is an NMOS device,
the P-type drive transistor is a PMOS device,
the N-type precharge transistor is an NMOS device, and
the P-type precharge transistor is a PMOS device.

10. The circuit of claim 8, wherein a threshold voltage of the P-type precharge transistor reduces current flow through the P-type precharge transistor once the output node reaches an intermediate voltage, and wherein a threshold voltage of the N-type precharge transistor reduces current flow through the N-type precharge transistor once the output node reaches an intermediate voltage.

11. An information-processing system comprising:
a memory;
input-output subsystem;
one or more processing elements, each including a vector processing unit operatively coupled to the memory and to the input-output subsystem, the vector processing unit further comprising a set of vector registers, wherein the set of vector registers includes an input; and
a clocked drive-and-precharge circuit for a set of input circuits, wherein the drive-and-precharge circuit includes:
a driver circuit having an output node connected to the input of the set of input circuits and a pair of complementary drive transistors configured to drive a first data signal onto the output node during a first phase of a clock cycle and configured to turn off during a second phase of the clock cycle; and
a clocked source-follower precharge circuit coupled to the output node and configured to turn off during the first phase of the clock cycle and configured to drive the output node to an intermediate voltage during the second phase of the clock cycle.

12. The system of claim 11, wherein the precharge circuit substantially reduces its current flow once the output node approaches the intermediate voltage.

13. The system of claim 11, wherein a value of the first data signal is coupled to the precharge circuit to control a direction of change in voltage of the output node.

14. The system of claim 11, wherein the pair of complementary drive transistors includes an N-type drive transistor and a P-type drive transistor, and wherein the precharge circuit includes:
a P-type precharge transistor having a first node electrically connected to a first node of the N-type drive transistor and having second node electrically connected to a second node of the N-type drive transistor and to the output node; and
an N-type precharge transistor having a first node electrically connected to a first node of the P-type drive transistor and to the output node and having second node electrically connected to a second node of the P-type drive transistor.

15. The system of claim 11, wherein the pair of complementary drive transistors includes an N-type drive transistor and a P-type drive transistor, and wherein the precharge circuit includes a P-type precharge transistor having a first node electrically connected to a first node of the N-type drive transistor and having second node electrically connected to a second node of the N-type drive transistor and to the output node, and an N-type precharge transistor having a first node electrically connected to a first node of the P-type drive transistor and to the output node and having second node electrically connected to a second node of the P-type drive transistor, and
wherein the circuit further comprises:
a first transistor that connects a voltage to a gate of the P-type pre charge transistor that turns off the P-type precharge transistor during the first phase of the clock cycle;
a second transistor that connects a voltage to a gate of the N-type precharge transistor that turns off the N-type pre charge transistor during the first phase of the clock cycle;
a third transistor that connects a first data signal to a gate of the P-type drive transistor during the first phase of the clock cycle;
a fourth transistor that connects the first data signal to a gate of the N-type drive transistor during the first phase of the clock cycle;
a fifth transistor that connects a voltage to a gate of the P-type drive transistor that turns off the P-type drive transistor during the second phase of the clock cycle;
a sixth transistor that connects a voltage to a gate of the N-type drive transistor that turns off the N-type drive transistor during the second phase of the clock cycle;
a seventh transistor that connects a second data signal to a gate of the P-type precharge transistor during the second phase of the clock cycle, wherein a value of the second data signal during the second phase of the clock cycle is based on a value of the first data signal during the first phase of the clock cycle; and
an eighth transistor that connects the second data signal to a gate of the N-type precharge transistor during the second phase of the clock cycle.

16. A method for driving a clocked drive-and-precharge circuit comprising:
driving an output node of the clocked drive-and-precharge circuit to a data value during a first phase of a clock cycle;
if a voltage corresponding to the data value of the output node is high during the first phase of the clock cycle, then driving the output node down toward an intermediate voltage during a second phase of the clock cycle;
if the voltage corresponding to the data value of the output node is low during the first phase of the clock cycle, then driving the output node up toward the intermediate voltage during the second phase of the clock cycle; and
wherein the driving the output node down toward an intermediate voltage includes providing a relatively high initial amount of current in clocked source-follower mode and then automatically reducing the amount of current drive as the output node approaches the intermediate voltage.

17. The method of claim 16, wherein the driving the output node up toward an intermediate voltage includes providing a relatively high initial amount of current and then reducing the amount of current drive as the output node approaches the intermediate voltage.

18. The method of claim 16, wherein the first phase of the clock cycle and the second phase of the clock cycle are each approximately one-half of the clock cycle.

19. A system for driving a clocked vector register drive-and-precharge circuit comprising:
a clock signal;
means, operatively coupled to the clock signal, for driving an output node of the clocked vector register drive-and-precharge circuit to a data value during a first phase of the clock signal, and if a voltage corresponding to the data value of the output node is high during the first phase of the clock cycle, then driving the output node down in a clocked source-follower mode toward an intermediate voltage during a second phase of the clock signal, and if the voltage corresponding to the data value of the output node is low during the first phase of the clock signal, then driving the output node up toward the intermediate voltage during the second phase of the clock cycle; and
wherein the means for driving the output node down toward an intermediate voltage includes a pass-gate configuration to connect signals to gates through a drain-source transistor connection.

20. The system of claim 19, wherein the means for driving the output node include a driver circuit that drives the output node either high or low during a first phase of each clock cycle, and a precharge circuit that then precharges the output node to an intermediate voltage during a second phase of the clock cycle in preparation for a following clock cycle.

21. The system of claim 20, wherein the precharge circuit includes source-follower-configured FETs to precharge, wherein these FETs turn off once the output voltage reaches the intermediate value.

22. A method for precharging a circuit line having a large number of loads, the method comprising:
driving the line to a midway voltage that is midway between high and low using a source-follower configuration fed by data clocked through a pass-gate to gates of precharge transistors, while simultaneously disconnecting the data from the line; and
thereafter, driving the line to a data value of zero or one fed by data clocked through a pass-gate to gates of drive transistors, while disconnecting the midway voltage from the line.

23. The method of claim 22, wherein the driving of the line to the midway voltage further includes
driving only one-half of a pre charge circuit based on a previous logical value on the line being precharged.

24. The method of claim 22, wherein the driving of the line to the midway voltage further includes driving with source-follower-configured FETs to precharge, wherein these FETs turn off once the output voltage reaches the midway voltage.

25. An apparatus comprising:
means for driving a signal line to a midway voltage that is midway between high and low during a first clock phase using a source- follower configuration fed by data clocked through a pass-gate to gates of precharge transistors, while simultaneously disconnecting the data from the line; and
means for driving the line to a data value of zero or one during a second clock phase fed by data clocked through a pass-gate to gates of drive transistors, while disconnecting the midway voltage from the line.

26. The apparatus of claim 25, wherein the means for driving of the line to the midway voltage further includes means for driving only one-half of a precharge circuit based on a previous logical value on the line being precharged.

27. The apparatus of claim 25, wherein the means for driving of the line to the midway voltage further includes source-follower-configured FETs to precharge, wherein these FETs turn off once the output voltage reaches the midway voltage.

28. An apparatus comprising:
an output signal line;
a clocked pair of source-follower complementary transistors each in a source-follower configuration that operate cooperatively to drive the signal output line to a voltage midway between high and low during a first clock phase; and
a clocked pair of complementary inverting-amplifier transistors each in an inverting-amplifier configuration that operate cooperatively to drive the signal output line to a data value of zero or one during a second clock phase.

29. The apparatus of claim 28, wherein the pair of source-follower complementary transistors are configured to have only one transistor of the pair based on a previous logical value on the line being precharged.

30. The apparatus of claim 28, wherein the pair of source-follower complementary transistors are source-follower-configured FETs that turn off once the output voltage reaches the midway voltage.

31. An apparatus comprising:
an output signal line;
a clocked pair of source-follower complementary transistors each in a source-follower configuration that operate cooperatively to drive the signal output line to a voltage midway between high and low during a first clock phase;
a clocked pair of complementary inverting-amplifier transistors each in an inverting-amplifier configuration that operate cooperatively to drive the signal output line to a data value of zero or one during a second clock phase;
wherein the clocked pair of complementary inverting-amplifier transistors includes an N-type drive transistor and a P-type drive transistor, and wherein the source-follower complementary transistors include a P-type precharge transistor having a first node electrically connected to a first node of the N-type drive transistor and having second node electrically connected to a second node of the N-type drive transistor and to the output node, and an N-type precharge transistor having a first node electrically connected to a first node of the P-type drive transistor and to the output node and having second node electrically connected to a second node of the P-type drive transistor, and
wherein the apparatus further comprises:
a first transistor that connects a voltage to a gate of the P-type precharge transistor that turns off the P-type precharge transistor during the first phase of the clock cycle;
a second transistor that connects a voltage to a gate of the N-type precharge transistor that turns off the N-type precharge transistor during the first phase of the clock cycle;
a third transistor that connects a first data signal to a gate of the P-type drive transistor during the first phase of the clock cycle;
a fourth transistor that connects the first data signal to a gate of the N-type drive transistor during the first phase of the clock cycle;
a fifth transistor that connects a voltage to a gate of the P-type drive transistor that turns off the P-type drive transistor during the second phase of the clock cycle;

a sixth transistor that connects a voltage to a gate of the N-type drive transistor that turns off the N-type drive transistor during the second phase of the clock cycle;

a seventh transistor that connects a second data signal to a gate of the P-type precharge transistor during the second phase of the clock cycle, wherein a value of the second data signal during the second phase of the clock cycle is based on a value of the first data signal during the first phase of the clock cycle; and an eighth transistor that connects the second data signal to a gate of the N-type precharge transistor during the second phase of the clock cycle.

* * * * *

UNITED STATES PATENT AND TRADEMARK OFFICE
CERTIFICATE OF CORRECTION

PATENT NO. : 7,071,736 B2
APPLICATION NO. : 10/848690
DATED : July 4, 2006
INVENTOR(S) : Jan A. Wikstrom It is certified that error appears in the above-identified patent and that said Letters Patent is hereby corrected as shown below:

In Column 1, Line 44 (going by lines of text, not by inaccurate number guides between text columns): Delete "scheme in which a high number of successive results on" and insert --scheme in which a high number of successive results are sent on-- therefor.

In Column 6, Line 9: In the abbreviation "VDD" the "DD" portion should be in subscript type-font.

In Column 7, Line 60: Delete "and PFET transistor 616 is off floating internal node" and insert --and PFET transistor 616 is off -- floating internal node-- therefor.

In Column 8, Line 1: Delete "and PFET transistor 615 is off floating" and insert --and PFET transistor 615 is off -- floating-- therefor.

In Column 8, Line 22: Delete the period that follows the words "a memory 730".

In Column 9, Line 21: Delete the word "during".

In Column 9, Line 29: Insert --a-- after the word "having" and before the words "second node".

In Column 9, Line 57: Delete "a eighth" and insert --an eighth-- therefor.

In Column 9, Line 33: Insert --a-- after the word "having" and before the words "second node".

In Column 9, Line 65: Insert --a-- after the word "having" and before the words "second node".

In Column 10, Line 2: Insert --a-- after the word "having" and before the words "second node".

In Column 10, Line 31: Delete "a eighth" and insert --an eighth-- therefor.

In Column 11, Line 13: Insert --subsystem 710, one or more-- after the words "an input-output" and before the words "processing elements 720".

In Column 11; Line 40: Insert --a-- after the word "having" and before the words "second node".

UNITED STATES PATENT AND TRADEMARK OFFICE
CERTIFICATE OF CORRECTION

PATENT NO. : 7,071,736 B2
APPLICATION NO. : 10/848690
DATED : July 4, 2006
INVENTOR(S) : Jan A. Wikstrom It is certified that error appears in the above-identified patent and that said Letters Patent is hereby corrected as shown below:

In Column 11, Line 44: Insert --a-- after the word "having" and before the words "second node".

In Column 11, Line 51: Insert --a-- after the word "having" and before the words "second node".

In Column 11, Line 55: Insert --a-- after the word "having" and before the words "second node".

In Column 12, Line 11: Delete "a eighth" and insert --an eighth-- therefor.

In Column 13, Line 14 (line 2 of claim 3): Delete the word "during".

In Column 13, Line 28 (line 10 of claim 5): Insert --a-- after the word "having" and before the words "second node".

In Column 14, Line 3 (line 18 of claim 7): Insert --a-- after the word "having" and before the words "second node".

In Column 14, Line 8 (line 23 of claim 7): Insert --a-- before the words "second node".

In Column 15, Line 56 (line 7 of claim 14): Insert --a-- after the word "having" and before the words "second node".

In Column 15, Line 61 (line 12 of claim 14): Insert --a-- after the word "having" and before the words "second node".

In Column 16, Line 2 (line 6 of claim 15): Insert --a-- after the word "having" and before the words "second node".

In Column 16, Line 7 (line 11 of claim 15): Insert --a-- before the words "second node".

UNITED STATES PATENT AND TRADEMARK OFFICE
CERTIFICATE OF CORRECTION

PATENT NO. : 7,071,736 B2
APPLICATION NO. : 10/848690
DATED : July 4, 2006
INVENTOR(S) : Jan A. Wikstrom It is certified that error appears in the above-identified patent and that said Letters Patent is hereby corrected as shown below:

In Column 18, Line 42 (line 18 of claim 31): Insert --a-- after the word "having" and before the words "second node".

Signed and Sealed this

Eleventh Day of September, 2007

JON W. DUDAS
*Director of the United States Patent and Trademark Office*